(12) United States Patent
Park et al.

(10) Patent No.: US 7,452,790 B2
(45) Date of Patent: Nov. 18, 2008

(54) METHOD OF FABRICATING THIN FILM TRANSISTOR

(75) Inventors: Hye-Hyang Park, Suwon-si (KR); Ki-Yong Lee, Yongin-si (KR)

(73) Assignee: Samsung SDI Co., Ltd., Suwon (KR)

( * ) Notice: Subject to any disclaimer, the term of this patent is extended or adjusted under 35 U.S.C. 154(b) by 0 days.

(21) Appl. No.: 11/017,689

(22) Filed: Dec. 22, 2004

(65) Prior Publication Data
US 2006/0030085 A1   Feb. 9, 2006

(30) Foreign Application Priority Data
Aug. 4, 2004   (KR) ..................... 10-2004-0061530

(51) Int. Cl.
*C30B 28/02* (2006.01)
*C30B 29/06* (2006.01)
*H01L 21/20* (2006.01)

(52) U.S. Cl. .............................. 438/486; 257/E21.535; 117/8; 438/166; 438/478

(58) Field of Classification Search ............ 117/4, 117/8, 931; 438/166, 478–479, 486–488, 438/542, 551, 558–559, 764; 257/E21.533–E21.535
See application file for complete search history.

(56) References Cited

U.S. PATENT DOCUMENTS 3,255,056 A * 6/1966 Becke et al. ................ 438/554

(Continued)

FOREIGN PATENT DOCUMENTS

JP         08-097137         4/1996

(Continued)

OTHER PUBLICATIONS

Choi, Jong-Hyun, et al. "Kinetics of Ni-Mediated Crystallization of a-Si Through a SiNx Cap Layer." J. Electrochem. Soc., vol. 151, No. 7 (2004): pp. G448-G451.*

*Primary Examiner*—Douglas M. Menz
*Assistant Examiner*—Matthew W Such
(74) *Attorney, Agent, or Firm*—H.C. Park & Associates, PLC

(57) ABSTRACT

Disclosed is a method of fabricating a thin film transistor in which, in order to control the concentration of metal catalysts remaining on a polycrystalline silicon layer when an amorphous silicon layer formed on an insulating substrate is crystallized into the polycrystalline silicon layer by a super grain silicon (SGS) crystallization method, the substrate is annealed so that a very small amount of metal catalyst is adsorbed or diffused into a capping layer, and then a crystallization process is carried out, thereby minimizing the concentration of the metal catalysts remaining on the polycrystalline silicon layer, as well as forming a thick metal catalyst layer. The method includes preparing an insulating substrate; sequentially forming an amorphous silicon layer, a capping layer, and a metal catalyst layer on the substrate; first annealing the substrate to adsorb or diffuse metal catalysts into the capping layer; removing the metal catalyst layer; second annealing the substrate to crystallize the amorphous silicon layer into a polycrystalline silicon layer by means of the metal catalyst; and removing the capping layer. Thus, with the method of fabricating the thin film transistor of the present invention, it is possible to minimize the concentration of the metal catalysts remaining on the polycrystalline silicon layer, as well as to form a thick metal catalyst layer.

20 Claims, 3 Drawing Sheets

U.S. PATENT DOCUMENTS

| | | | |
|---|---|---|---|
| 3,808,060 A * | 4/1974 | Hays et al. | 438/376 |
| 5,888,857 A * | 3/1999 | Zhang et al. | 438/162 |
| 6,162,667 A * | 12/2000 | Funai et al. | 438/166 |
| 6,346,437 B1 * | 2/2002 | Maekawa et al. | 438/166 |
| 6,420,246 B1 * | 7/2002 | Yamazaki et al. | 438/476 |
| 6,506,636 B2 * | 1/2003 | Yamazaki et al. | 438/149 |
| 6,613,613 B2 * | 9/2003 | Yamazaki et al. | 438/149 |
| 6,620,661 B2 * | 9/2003 | Maekawa et al. | 438/166 |
| 6,777,714 B2 * | 8/2004 | Muramatsu et al. | 257/75 |
| 6,784,455 B2 * | 8/2004 | Maekawa et al. | 257/66 |
| 6,884,698 B1 * | 4/2005 | Ohtani et al. | 438/486 |
| 6,997,985 B1 * | 2/2006 | Yamazaki et al. | 117/8 |
| 2002/0086471 A1 * | 7/2002 | Maekawa et al. | 438/166 |
| 2006/0033106 A1 * | 2/2006 | Seo et al. | 257/66 |
| 2006/0130939 A1 * | 6/2006 | Jang et al. | 148/516 |
| 2006/0286780 A1 * | 12/2006 | Jang et al. | 438/482 |

FOREIGN PATENT DOCUMENTS

| | | | |
|---|---|---|---|
| KR | 2003060403 A | * | 7/2003 |
| KR | 10-2004-0040762 | | 5/2004 |
| WO | WO 2004042805 A1 | * | 5/2004 |

* cited by examiner

METHOD OF FABRICATING THIN FILM TRANSISTOR

CROSS-REFERENCE TO RELATED APPLICATION

This application claims priority to and the benefit of Korean Patent Application No. 2004-61530, filed Aug. 4, 2004, the disclosure of which is incorporated herein by reference in its entirety.

BACKGROUND OF THE INVENTION

1. Field of the Invention

The present invention relates to a method of fabricating a thin film transistor and, more particularly, to a method of fabricating a thin film transistor in which, in order to control the concentration of metal catalysts remaining on a polycrystalline silicon layer when an amorphous silicon layer formed on an insulating substrate is crystallized into the polycrystalline silicon layer using a super grain silicon (SGS) crystallization method, the substrate is annealed so that a very small amount of metal catalyst is adsorbed or diffused into a capping layer, and then a crystallization process is carried out.

2. Description of Related Art

Generally, in a thin film transistor for use in display devices, an amorphous silicon is deposited on a transparent substrate of glass, quartz or the like, is dehydrogenated, and then is crystallized to form a semiconductor layer.

At this time, the semiconductor layer, which constitutes source, drain and channel regions of the thin film transistor, is formed by depositing the amorphous silicon layer on the transparent substrate such as glass using a chemical vapor deposition (CVD) method. However, the silicon layer directly deposited on the substrate by, for example, the CVD method has low electron mobility because it contains hydrogen of about 12%. In addition, when the amorphous silicon layer having such low electron mobility is annealed and crystallized into a silicon layer of a crystalline structure having high electron mobility, the silicon layer is damaged by the cracking of the contained hydrogen. A dehydrogenation process is carried out to prevent the cracking phenomenon of the hydrogen generated upon the crystallization. The dehydrogenation process is generally performed by annealing at a temperature of about 400° C. or more for tens of minutes to a few hours in a furnace. A crystallization process is then carried out to crystallize the dehydrogenated amorphous silicon layer.

A method of crystallizing the amorphous silicon into polysilicon includes a solid phase crystallization method, an excimer laser crystallization method, a metal induced crystallization method, a metal induced lateral crystallization method, and the like. The solid phase crystallization method is a method of annealing an amorphous silicon layer over a few hours to tens of hours at a temperature about 700° C. or less that is a transition temperature of glass, which is a material forming a substrate of a display device that uses thin film transistors. The excimer laser crystallization method is a method in which a silicon layer is irradiated by an excimer laser, and heated locally at a high temperature for a very short time period to crystallize. The metal induced crystallization method is a method that uses a phenomenon that amorphous silicon is crystallized to polysilicon through a phase change by a metal, such as nickel, palladium, gold, aluminum or the like, which comes in contact with or is injected into an amorphous silicon layer. The metal induced lateral crystallization method is a method of crystallizing a silicon layer using a method in which silicide created by the reaction of metal and silicon is propagated continuously and laterally to induce the sequential crystallization of silicon.

However, the solid phase crystallization method has a disadvantage that a substrate is easily deformed due to too long processing time and long-time annealing at a high temperature. The excimer laser crystallization method has a disadvantage that it needs an expensive laser apparatus, as well as an interface property between a semiconductor layer and a gate insulating layer is bad due to extrusions created on a polycrystallized surface. In the case of crystallization that uses the metal induced crystallization method or the metal induced lateral crystallization method, there is a disadvantage that metal catalysts remain on a crystallized polycrystalline silicon layer to increase a leakage current in a semiconductor layer of a thin film transistor.

SUMMARY OF THE INVENTION

The present invention, therefore, solves aforementioned problems associated with conventional devices by providing a method of fabricating a thin film transistor in which, in order to control the concentration of metal catalysts remaining on a polycrystalline silicon layer when an amorphous silicon layer formed on an insulating substrate is crystallized into the polycrystalline silicon layer using a super grain silicon (SGS) crystallization method, the substrate is annealed so that a very small amount of metal catalyst is adsorbed or diffused into a capping layer, and then a crystallization process is carried out, thereby minimizing the concentration of the metal catalysts remaining on the polycrystalline silicon layer, as well as forming a thick metal catalyst layer.

In an exemplary embodiment of the present invention, a method of fabricating a thin film transistor includes: preparing an insulating substrate; sequentially forming an amorphous silicon layer, a capping layer, and a metal catalyst layer on the substrate; first annealing the substrate to adsorb or diffuse a metal catalyst into the capping layer; removing the metal catalyst layer; second annealing the substrate to crystallize the amorphous silicon layer into a polycrystalline silicon layer by means of the metal catalyst; and removing the capping layer.

The method may further include: after removing the capping layer, patterning the polycrystalline silicon layer to form a semiconductor layer; and forming a gate insulating layer, a gate electrode, an interlayer insulting film, and source and drain electrodes on the semiconductor layers.

The capping layer may be formed of silicon nitride ($SiN_x$).

BRIEF DESCRIPTION OF THE DRAWINGS

The above and other features of the present invention will be described in reference to certain exemplary embodiments thereof with reference to the attached drawings in which.

DETAILED DESCRIPTION OF THE INVENTION

Figure 1A:
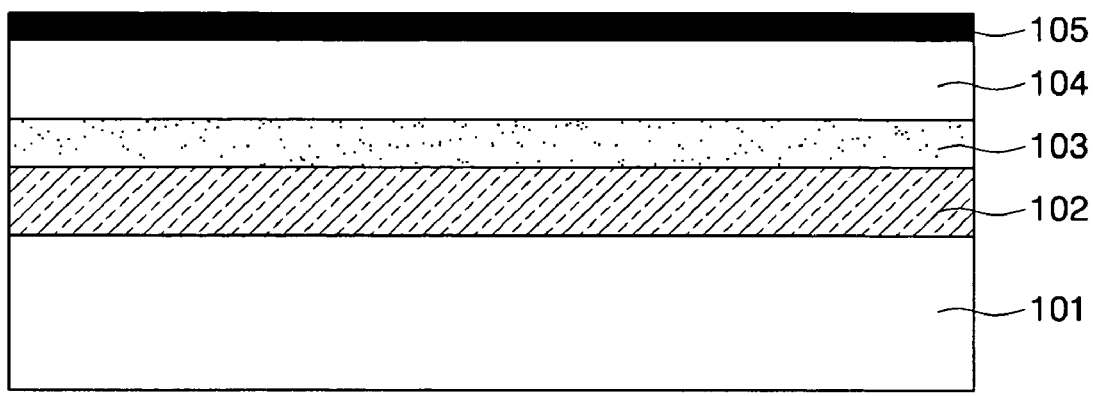
FIGS. 1A to 1D are cross-sectional views showing a process of crystallizing an amorphous silicon layer into a polycrystalline silicon layer according to the present invention.

The present invention will now be described more fully hereinafter with reference to the accompanying drawings, in which exemplary embodiments of the invention are shown. In the drawings, the thickness of the layers and regions are exaggerated for clarity.

FIGS. 1A to 1D are cross-sectional views showing a process of crystallizing an amorphous silicon layer into a polycrystalline silicon layer according to the present invention.

FIG. 1A is a cross-sectional view showing a process of sequentially forming a buffer layer, an amorphous silicon layer, a capping layer and a metal catalyst layer on an insulating substrate. As shown in FIG. 1, a buffer layer 102 is formed on a transparent insulating substrate 101, such as glass or plastic, to prevent diffusion of moisture or impurities generated from the substrate or to adjust a heat transfer speed upon crystallization, such that a semiconductor layer is well crystallized.

An amorphous silicon layer 103 is then formed on the buffer layer 102 using a physical vapor deposition (PVD) method or chemical vapor deposition (CVD) method. At this time, the silicon layer directly deposited by the CVD method has low electron mobility because it contains hydrogen of about 12%. In addition, when the amorphous silicon layer having such low electron mobility is annealed and crystallized into a silicon layer of a crystalline structure having high electron mobility, the silicon layer is damaged by the cracking of the contained hydrogen. A dehydrogenation process is carried out to prevent the cracking phenomenon of the hydrogen generated upon the crystallization. The dehydrogenation process is generally performed by annealing at a temperature of about 400° C. or more for tens of minutes to a few hours in a furnace.

A capping layer 104 is then formed on the amorphous silicon layer 103. The capping layer 104 should have a property that a very small amount of metal catalyst is well adsorbed or diffused since the capping layer 104 is a layer into which metal catalysts are adsorbed or diffused by annealing in a subsequent process. The capping layer 104 may be formed of an insulating layer such as silicon oxide ($SiO_2$) and, preferably, silicon nitride ($SiN_x$).

The metal catalysts are then deposited on the capping layer 104 to form a metal catalyst layer 105. The metal catalyst may be at least one of Ni, Pd, Ti, Ag, Au, Al, Sn, Sb, Cu, Co, Mo, Tr, Ru, Rh, Cd and Pt and, preferably, Ni. This is because the Ni has the best characteristics in crystallizing an amorphous silicon layer to a polycrystalline silicon layer.

For a conventional metal induced crystallization (MIC) or metal induced lateral crystallization (MILC) method, the metal catalyst layer should be formed in a thickness as thin as about 1 Å using a sputtering apparatus. This is because that the metal catalysts exist as metal residues of the semiconductor layer after the crystallization process to increase a leakage current in the semiconductor layer. Therefore, the metal catalyst layer, as described above, should be uniformly formed to a thickness of about 1 Å over the overall substrate so that a minimal amount of metal catalyst is deposited. However, the method of depositing a very small amount of metal catalyst has problems in that it is difficult to form the metal catalyst layer using a sputtering apparatus, as well as the metal catalyst layer is not uniformly formed on the entire surface of the substrate. On the other hand, in the case where the crystallization method of the present invention is used, the metal catalyst layer may be formed to such a thickness that the metal catalysts can absorb energy and be adsorbed or diffused into a low concentration diffusion layer in the annealing process, for example, in a thickness as thick as 200 to 1000 Å without needing a very thin and uniform metal catalyst layer as in the prior art. This is because the concentration of the metal catalysts diffused into the amorphous silicon layer is controlled by the capping layer independent of the thickness of the metal catalyst layer, namely, no matter how much the amount of the formed metal catalysts be.

Figure 1B:
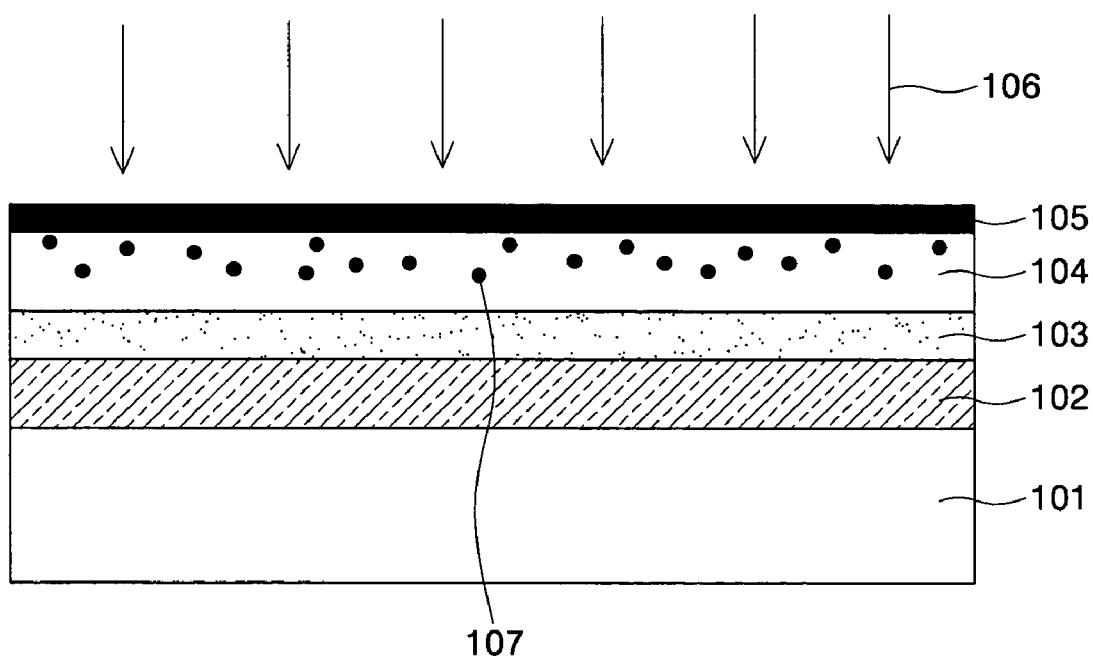

FIG. 1B is a cross-sectional view showing a process of first annealing the substrate to adsorb or diffuse metal catalysts into a capping layer. FIG. 1B shows a cross-sectional view of a process in which the substrate having a buffer layer, an amorphous silicon layer, a capping layer and a metal catalyst layer is subjected to a first annealing process 106, such as a rapid thermal annealing (RTA) process or a laser irradiation process, so that the metal catalysts in the metal catalyst layer are adsorbed or diffused into the capping layer. At this time, the concentration of the metal catalysts 107, which are adsorbed or diffused into the capping layer, is $1\times10^{10}$ to $1\times10^{12}$ atoms/cm$^3$. This concentration of the metal catalysts is achieved by controlling the temperature and time of the first annealing process.

At this time, the first annealing process is carried out at a temperature of 200 to 600° C., at which the metal catalysts are easily adsorbed or diffused into the capping layer, for a predetermined time suitable for a desired concentration of the metal catalysts to be adsorbed or diffused.

Figure 1C:
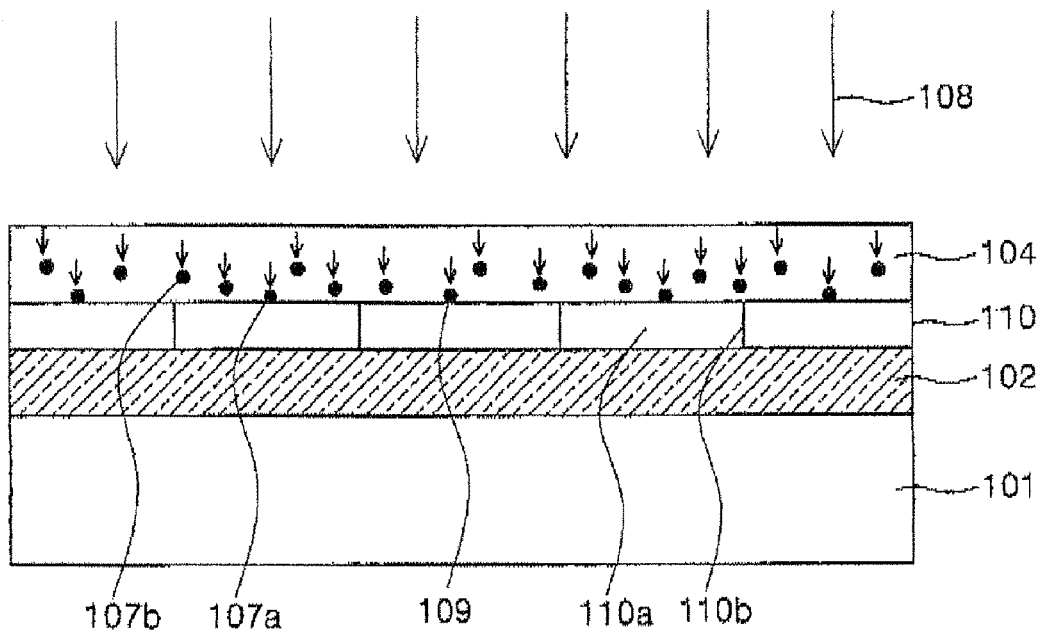

FIG. 1C is a cross-sectional view showing a process in which the metal catalyst layer is removed and the substrate is subjected to a second annealing process so that the amorphous silicon layer is crystallized into a polycrystalline silicon layer by the metal catalysts. As shown, the metal catalysts are adsorbed or diffused into the capping layer in the first annealing process and, thereafter, the metal catalyst layer is removed.

The substrate having the buffer layer, the amorphous silicon layer, and the capping layer into which a very small amount of metal catalyst is adsorbed or diffused is then annealed by the second annealing process 108. At this time, the metal catalysts, which are adsorbed or diffused into the capping layer by the first annealing process, are diffused into an interface between the capping layer and the amorphous silicon layer and become seeds 109 for crystal production. The amorphous silicon layer is crystallized into the polycrystalline silicon layer 110 by the metal catalysts diffused into the interface, namely, the seeds 109.

At this time, the concentration of the metal catalysts, which are adsorbed or diffused into the capping layer by the first annealing process, is $1\times10^{10}$ to $1\times10^{12}$ atoms/cm$^3$, while the concentration of the metal catalysts, which are diffused into the interface between the capping layer and the amorphous silicon layer and contribute to the crystallization by the second annealing process, becomes smaller than the concentration at which the metal catalysts are adsorbed or diffused into the capping layer. Further, some of the metal catalysts contributing to the crystallization remain on the polycrystalline silicon layer. Accordingly, a low concentration of the metal catalysts actually remains on the polycrystalline silicon layer.

That is, as shown in FIG. 1B, there is a little difference in distance by which the metal catalysts, which are adsorbed or diffused into the capping layer, move into the capping layer during the first annealing process. This difference also occurs when the metal catalysts move to the interface between the capping layer and the amorphous silicon layer during the second annealing process. Accordingly, the crystallization of the amorphous silicon is carried out by first arriving metal catalysts 107a, namely, seeds, and metal catalysts 107b present in the capping layer have no influence on the crystallization.

Thus, one grain 110a will be grown in one seed formed by the metal catalysts that first arrives at the interface between the diffusion layer and the amorphous silicon layer, and a grain boundary 110b will be formed when two or more of grains are adjacent to each other. Accordingly, when the amount of the metal catalysts arriving at the interface (i.e., control of the number of the crystal growth seeds at the interface through the control of the diffusion of the metal catalysts in the capping layer) is controlled, the size of the grains in the polycrystalline silicon layer increases and the number of the grain boundaries reduces.

At this time, at least one of a furnace process, a rapid thermal annealing (RTA) process, and an excimer laser annealing (ELA) process is used as the second annealing process, and the second annealing process is performed at a temperature of 400 to 1300° C. to crystallize the amorphous silicon layer.

The above-mentioned crystallization is called a super grain silicon (SGS) crystallization method in which a capping layer is formed on an amorphous silicon layer to control the diffusion of metal catalysts, a metal catalyst layer (or a crystallization-induced material) is formed on the capping layer, the metal catalysts are diffused through the capping layer and are moved at a low concentration to the interface between the amorphous silicon layer and the capping layer, and the metal catalysts are used as seeds for crystal growth, so that the leakage current is reduced due to large grains and less remaining metal catalysts.

Figure 1D:
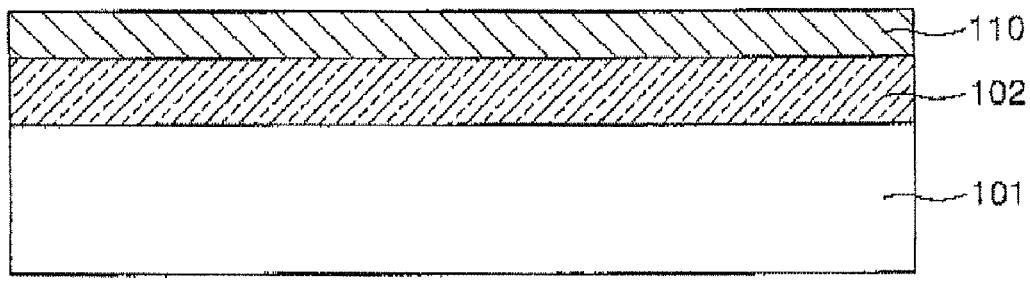

FIG. 1D is a cross-sectional view showing a process of forming a polycrystalline silicon layer having a low concentration of remaining metal catalysts by removing the capping layer. As shown in FIG. 1D, a polycrystalline silicon layer having a very low concentration of remaining metal catalysts is formed by removing the capping layer. At this time, the metal catalysts, which are formed at the interface between the capping layer and the polycrystalline silicon layer, are concurrently removed while the capping layer is removed, resulting in a clear interface.

Figure 2:
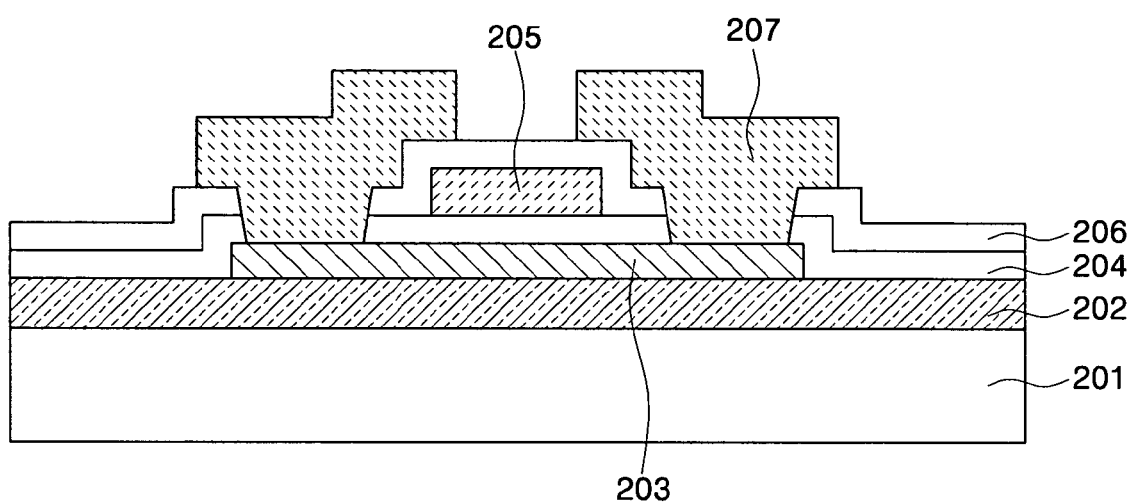
FIG. 2 is a cross-sectional view showing a process of fabricating a thin film transistor using the polycrystalline silicon layer formed according to the present invention.

FIG. 2 is a cross-sectional view showing a process of fabricating a thin film transistor using the polycrystalline silicon layer formed according to the present invention. As shown in FIG. 2, a buffer layer 202 is formed on an insulating substrate 201 such as plastic or glass. A polycrystalline silicon layer is then formed by the same method as described in FIGS. 1A to 1D and is patterned to form a semiconductor layer 203.

An insulating layer, such as a silicon oxide layer or a silicon nitride layer, is then formed in a single layer or a multi-layer to form a gate insulating layer 204. A material for forming a gate electrode is then deposited and patterned on the entire surface of the substrate to form a gate electrode 205. At this time, an impurity implantation process may be carried out on the semiconductor layer using the gate electrode 205 as a mask to define source and drain regions and a channel region.

Subsequently, an insulating layer, such as a silicon oxide layer or a silicon nitride layer, is formed in a single layer or a multi-layer on the entire surface of the substrate to form an interlayer insulating film 206. Predetermined regions of the interlayer insulating film 206 and the gate insulating film 204 are etched to form a contact hole that exposes a portion of the semiconductor layer 203. Thereafter, a material for forming source and drain electrodes is deposited and patterned on the entire surface of the substrate to form source and drain electrodes 207, resulting in the thin film transistor.

In the thin film transistor fabricated by the method as described above, the semiconductor layer of the thin film transistor is formed of the polycrystalline silicon layer crystallized by the SGS crystallization method. For the semiconductor layer crystallized by the SGS crystallization method, it is possible to increase the size of the grains compared to grains crystallized by other crystallization methods. Accordingly, high electron mobility is achieved as well as a small amount of impurity, such as metal catalysts, remains on the semiconductor layer, resulting in a reduced leakage current.

Thus, with the method of fabricating the thin film transistor of the present invention, it is possible to minimize the concentration of the metal catalysts remaining on the polycrystalline silicon layer, as well as to form a thick metal catalyst layer. In addition, by fabricating the thin film transistor using such a polycrystalline silicon layer, it is possible to increase the size of the grains compared to any grains crystallized by other crystallization methods. Accordingly, high electron mobility is achieved as well as a small amount of impurity, such as metal catalysts, remains on the semiconductor layer, resulting in a reduced leakage current.

Although the present invention has been described with reference to certain exemplary embodiments thereof, it will be understood by those skilled in the art that a variety of modifications and variations may be made to the present invention without departing from the spirit or scope of the present invention defined in the appended claims, and their equivalents.

What is claimed is:

1. A method of fabricating a thin film transistor, comprising:
   preparing an insulating substrate;
   sequentially forming an amorphous silicon layer, a capping layer, and a metal catalyst layer on the substrate;
   first annealing the substrate, adsorbing or diffusing a metal catalyst of the metal catalyst layer into the capping layer;
   completely removing the metal catalyst layer after first annealing the substrate and before second annealing the substrate;
   second annealing the substrate, crystallizing the amorphous silicon layer into a polycrystalline silicon layer by means of the metal catalyst that is adsorbed or diffused into the capping layer; and
   removing the capping layer.

2. The method according to claim 1, further comprising:
   after removing the capping layer,
   patterning the polycrystalline silicon layer, forming a semiconductor layer; and
   forming a gate insulating layer, a gate electrode, an interlayer insulting film, and source and drain electrodes on the semiconductor layer.

3. The method according to claim 1, wherein the capping layer is formed of an insulating layer.

4. The method according to claim 1, wherein the capping layer is formed of silicon nitride ($SiN_x$).

5. The method according to claim 1, wherein the first annealing is any one of a rapid thermal annealing (RTA) process and a laser irradiation process.

6. The method according to claim 1, wherein the first annealing is performed at a temperature of 200 to 600° C.

7. The method according to claim 1, wherein the metal catalyst layer contains at least one selected from a group consisting of Ni, Pd, Ti, Ag, Au, Al, Sn, Sb, Cu, Co, Mo, Tr, Ru, Rh, Cd and Pt.

8. The method according to claim 1, wherein the metal catalyst layer contains at least Ni.

9. The method according to claim 1, wherein the metal catalyst layer has a thickness of 200 to 1000 Å.

10. The method according to claim 1, wherein the metal catalyst has a concentration of $1\times10^{10}$ to $1\times10^{12}$ atoms/cm$^3$.

11. The method according to claim 1, wherein the second annealing is performed at a temperature of 400 to 1300° C.

12. A method of fabricating a thin film transistor, comprising:

arranging an amorphous silicon layer on a substrate;

arranging a capping layer on the amorphous silicon layer;

arranging a metal catalyst layer on the capping layer;

annealing, introducing a metal catalyst of the metal catalyst layer into the capping layer;

completely removing the metal catalyst layer; and annealing, forming a polycrystalline silicon layer from the amorphous silicon layer by means of the metal catalyst introduced into the capping layer after completely removing the metal catalyst layer.

13. The method according to claim 12, further comprising:

removing the capping layer;

patterning the polycrystalline silicon layer, forming a semiconductor layer; and forming a gate insulating layer, a gate electrode, an interlayer insulting film, and source and drain electrodes on the semiconductor layer.

14. The method according to claim 12, wherein the capping layer is formed of an insulating layer.

15. The method according to claim 12, wherein the capping layer is formed of silicon nitride ($SiN_x$).

16. The method according to claim 12, wherein the annealing, introducing the metal catalyst into the capping layer is any one of a rapid thermal annealing (RTA) process and a laser irradiation process.

17. The method according to claim 12, wherein the annealing, introducing the metal catalyst into the capping layer is performed at a temperature of 200 to 600° C., and the annealing, forming the polycrystalline silicon layer is performed at a temperature of 400 to 1300° C.

18. The method according to claim 12, wherein the metal catalyst layer contains at least one selected from the group consisting of Ni, Pd, Ti, Ag, Au, Al, Sn, Sb, Cu, Co, Mo, Tr, Ru, Rh, Cd and Pt.

19. The method according to claim 12, wherein the metal catalyst layer has a thickness of 200 to 1000 Å.

20. The method according to claim 12, wherein the metal catalyst has a concentration of $1 \times 10^{10}$ to $1 \times 10^{12}$ atoms/cm$^3$.

* * * * *